(12) United States Patent
Chen et al.

(10) Patent No.: US 9,741,602 B2
(45) Date of Patent: Aug. 22, 2017

(54) CONTACT FOR A NON-VOLATILE MEMORY AND METHOD THEREFOR

(75) Inventors: Gong Chen, Austin, TX (US); Linghui Wu, Austin, TX (US)

(73) Assignee: NXP USA, INC., Austin, TX (US)

( * ) Notice: Subject to any disclaimer, the term of this patent is extended or adjusted under 35 U.S.C. 154(b) by 1233 days.

(21) Appl. No.: 13/227,965

(22) Filed: Sep. 8, 2011

(65) Prior Publication Data

US 2013/0062773 A1    Mar. 14, 2013

(51) Int. Cl.
 *H01L 21/00* (2006.01)
 *H01L 21/762* (2006.01)
 *H01L 23/485* (2006.01)
 *H01L 27/11521* (2017.01)

(52) U.S. Cl.
 CPC ...... *H01L 21/76224* (2013.01); *H01L 23/485* (2013.01); *H01L 27/11521* (2013.01); *H01L 2924/0002* (2013.01)

(58) Field of Classification Search
 USPC .......................................... 257/774
 See application file for complete search history.

(56) References Cited

U.S. PATENT DOCUMENTS

| | | | |
|---|---|---|---|
| 7,284,231 B2 | 10/2007 | Lucas et al. | |
| 2001/0045658 A1* | 11/2001 | Deboer et al. | 257/758 |
| 2004/0140495 A1* | 7/2004 | Uchiyama et al. | 257/296 |
| 2005/0072998 A1* | 4/2005 | Miura et al. | 257/295 |
| 2007/0263445 A1* | 11/2007 | Emden et al. | 365/185.12 |
| 2007/0269971 A1* | 11/2007 | Kim | 438/597 |

* cited by examiner

*Primary Examiner* — William Harriston

(57) ABSTRACT

A semiconductor device is disclosed that comprises a first non-volatile memory cell, a second non-volatile memory cell, an active region between the first and second memory cells, and an electrically conductive contact touching the active region, wherein the contact has a horizontal cross-section that is at least five percent smaller in a first dimension than in a second dimension.

17 Claims, 2 Drawing Sheets

CONTACT FOR A NON-VOLATILE MEMORY AND METHOD THEREFOR

BACKGROUND

Field

This disclosure relates generally to semiconductor contacts, and more specifically, to contacts for a non-volatile memory.

Related Art

Non-volatile memories (NVMs) continue to grow in importance. It has become common for at least small amounts of NVM to be present on an integrated circuit. Also stand alone NVMs continue to be important. In non-volatile memories, it is common for adjacent memory cells to share adjacent source/drain regions in which case a contact to the common source/drain region is between gate stacks of the adjacent memory cells. The gate stacks are close together to save space. The placement of the contact is thus critical. Due to misalignment, the contact can be very close to the gate stack so that only a thin dielectric remains between the contact and the gate stack. With the relatively high voltages used in programming and erasing NVM cells, the thin dielectric resulting from a misaligned contact may result in a voltage breakdown of the thin dielectric, shorting the gate stack to the contact. Thus, the gate stacks need to be sufficiently far apart to prevent the contact, in a misalignment situation, from shorting to the closest gate stack which is most likely to occur during program or erase when higher voltages are applied.

Thus there is a need for improving the misalignment tolerance for a contact being formed between gate stacks of an NVM.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a contact between gate stacks of non-volatile memory (NVM) cells is formed in a shape that retains equivalent conductance while providing more alignment margin. The shape is drawn as a rectangle but, through processing, provided as an oval. The result is that in the lateral direction directly between adjacent gate stacks, the contact is thinner and in the direction orthogonal to the line between adjacent gate stacks, the contact is thicker. Thus for a given conductance of the contact, there is more margin for misalignment of the oval contact than for a circular contact. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
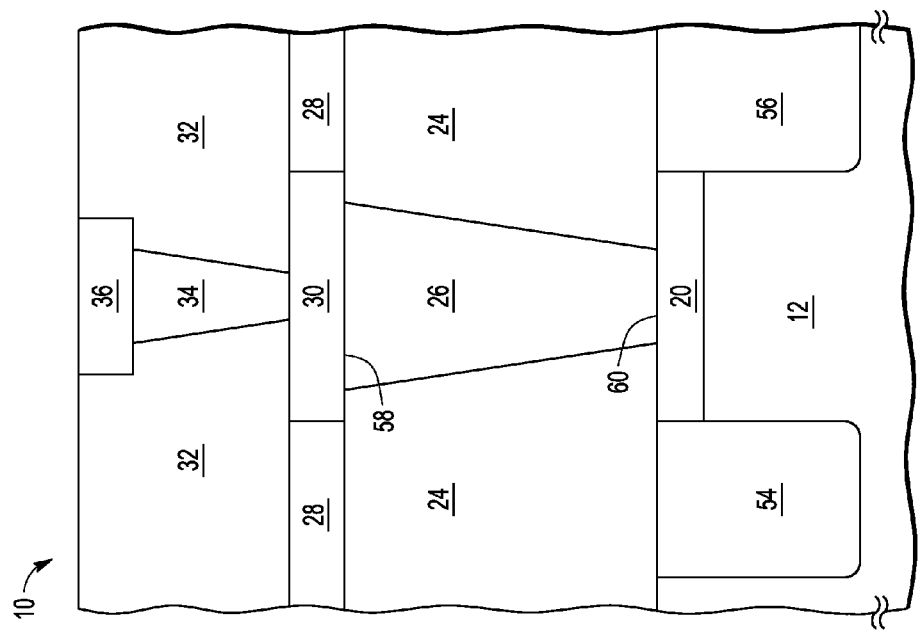
FIG. 1 is a cross section of a semiconductor device according to an embodiment.

Shown in FIG. 1 is a semiconductor device structure 10 having a substrate 12, a non-volatile memory (NVM) cell 13 having a gate stack 14 on substrate 12, an NVM cell 15 having a gate stack 16 on substrate 12, a source/drain 18 in substrate 12 on a first side of gate stack 14, a source/drain 20 on a second side of gate stack 14 opposite to the first side of gate stack 14 and on a first side gate stack 16, a source/drain region 22 on a second side of gate stack 16 opposite to the first side of gate stack 16, a contact 26 contacting source drain region 20, an interlayer dielectric (ILD) 24 around contact 26 and over memory cells 13 and 15, an ILD 28 over ILD 24, a first interconnect metal 30 formed within ILD 28 and on contact 26, an ILD 32 over ILD 28; a via 34 within a trench of ILD 32 contacting interconnect metal 30, and a interconnect metal 36 contacting via 34. NVM cells may be called memory cells. Although not shown in FIG. 1, interconnect metal 36 is formed in a trench in ILD 32. Memory cell 13 includes gate stack 14, source/drain region 18, and source/drain region 20. Memory cell 15 includes gate stack 16, source/drain region 20, and source/drain region 22. Memory cells 13 and 15 share source/drain region 20. Gate stack 14 includes a gate dielectric on substrate 12, a floating gate 40 on gate dielectric 38, a dielectric layer 42 on floating gate 40, and a control gate on dielectric layer 42. Gate stacks 14 and 16 may further include sidewall spacers and liners, not shown, which may be used to form source/drain regions 18, 20, and 22 in a desired form. Gate dielectrics 38 and 46 may be formed in conventional fashion such as by growing oxide or depositing a high K dielectric. Floating gates 40 and 48 may be polysilicon or another conductive material, a plurality of nanocrystals, or a plurality of different conductive layers. Dielectric layer 42 may be a single dielectric or a plurality of dielectric layers such as an oxide-nitride-oxide stack. Control gate 44 may be a polysilicon, another conductive layer, or may be a plurality of conductive layers. ILDs 24, 28, and 32 may be a deposited oxide and each may also be a combination of dielectric layers. Contact 26, interconnect metal 30, via 34, and interconnect metal 36 may be copper and include other conductive materials for adhesion and as diffusion barriers.

Also shown in FIG. 1 is an area 60 where contact 26 makes contact with source/drain 20 and an area 58 where contact 26 makes contact with interconnect metal 30. Contact 26 is in the shape of an oval at areas 58 and 60. In the cross section of FIG. 1, contact 26 is shown in the narrow dimension of the oval and thus provides more alignment margin between control gates 14 and 16 than would a circular contact of the same areas as areas 58 and 60.

Figure 2:
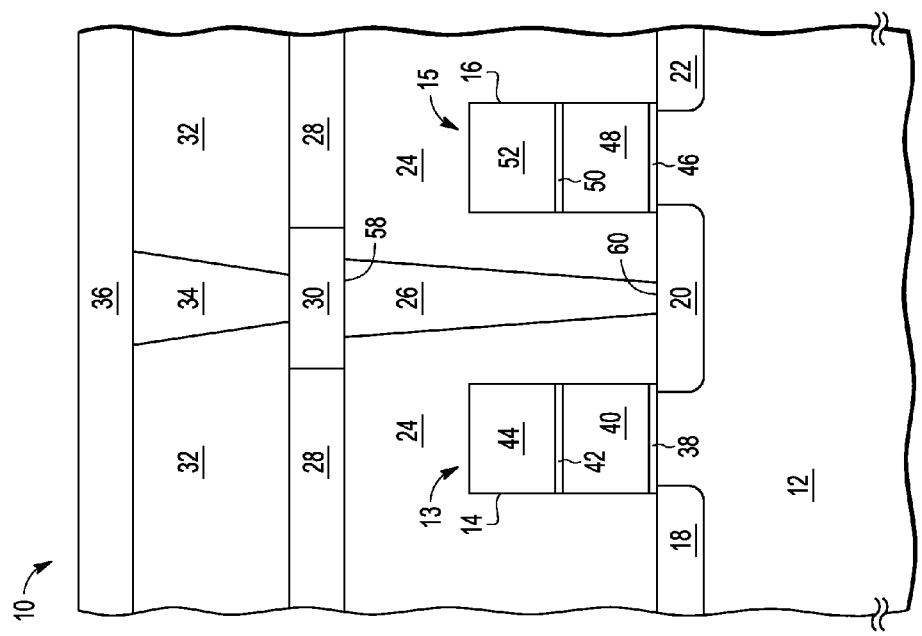
FIG. 2 is a cross section of the semiconductor device of FIG. 1 taken at a different angle.

Shown in FIG. 2 is a cross section of semiconductor device structure 10 in a cross section orthogonal to that of FIG. 1 showing a shallow trench isolation 54 and a shallow trench isolation 56 bordering source/drain region 20. In this cross section contact 26 shows the wide dimension of the oval. This also shows that interconnect metal 36 is in a trench in ILD 32. Interconnect metal 36 may be a bit line of a memory that is used for reading, programming, and erasing memory cells 13 and 15.

Figure 3:
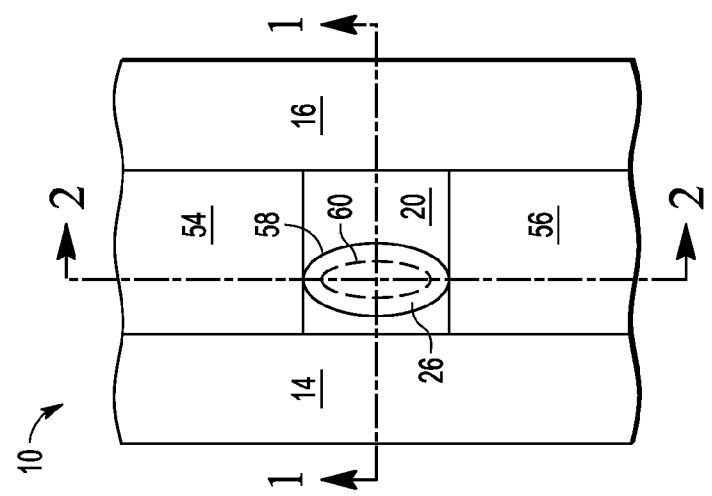
FIG. 3 is a top view of the semiconductor device of FIG. 1.

Shown in FIG. 3 is a top view of semiconductor device structure 10 showing source/drain region 20, gate stacks 14 and 16, trench isolation 54 and 56, contact 26, areas 58 and 60, and where the cross sections of FIGS. 1 and 2 are taken.

This shows that in the wide dimension of contact 26 there is no risk of shorting to another feature whereas the narrow dimension of the oval is advantageously placed to increase alignment margin of contact 26. Areas 58 and 60 at the end points of contact 26 show the oval shape of contact 26. Cross sections anywhere along contact 26 also would show the oval shape with a size a between those of areas 58 and 60. Described as an oval, the point is that in a horizontal cross section on dimension is greater than the other. In amount difference for a given area will increase the margin for placing the contact. Thus, for example, if one dimension is at least 5 percent different from the other, there is an improvement in placement margin.

Figure 4:
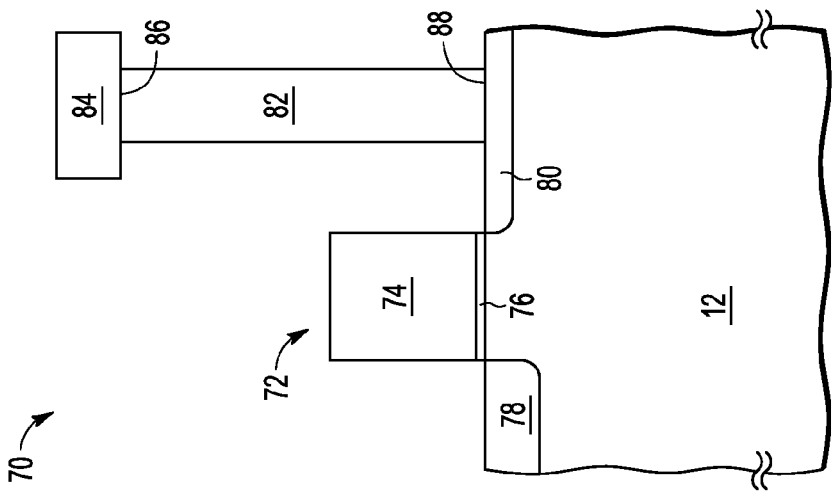
FIG. 4 is a cross section of a semiconductor device made on a substrate the same as that of the semiconductor device of FIG. 1.

Shown in FIG. 4 is a semiconductor device structure 70 also formed on substrate 12 shown in FIGS. 1 and 2. Semiconductor device structure 70 including a transistor 72 that includes a gate dielectric 76, a gate 74 on gate dielectric 76, a source/drain 78, and a source drain 80. Also shown is a circular contact 82 contacting source/drain region 80 and an interconnect layer 84. Contact 82 has a circular area 88 in contact with source/drain region 80 and circular area 86 in contact with interconnect metal 84.

Figure 5:
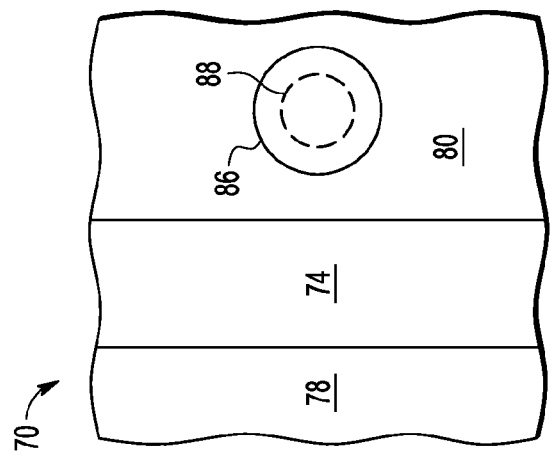
FIG. 5 is a top view of the semiconductor device of FIG. 4.

Shown in FIG. 5 is a top view of semiconductor device structure 70 depicting the circular nature of contact 80. Area 88 in this example is equal to area 60 and area 86 is equal to area 58 which results in contacts 82 and 26 having the same conductance. For the same area, contact 82, being circular, extends in all directions from its center the same amount. Its diameter is greater than the narrow dimension of the oval of contact 26. Thus, for a given location of the contacts, contact 82 will have a perimeter closer to gate 74 than a perimeter of contact 26 will be to gate 14. Thus, the alignment tolerance of contact 26 is an improvement over a circular contact of the same conductivity. The improvement can be either reducing the distance between gates of the NVM or improving yield due to reduced failures due to shorts between the contact and the control gates. Circular contacts can still be used for situations where they are best as shown for contact 82. Transistor 72 is representative of logic transistors used on the same integrated circuit as memory cells 13 and 15.

By now it should be appreciated that there has been provided a semiconductor device including a first non-volatile memory cell. The semiconductor device further includes a second non-volatile memory cell. The semiconductor device further includes an active region between the first and second non-volatile memory cells. The semiconductor device further includes an electrically conductive contact touching the active region, wherein the contact has an oval cross-section. The semiconductor device may have a further characterization by which the electrically conductive contact conducts current for programming the first and second non-volatile memory cells. The semiconductor device may have a further characterization by which a shorter dimension of the oval cross-section is closer to sidewalls of the first and second non-volatile memory cells than a longer dimension of the oval cross-section. The semiconductor device may further comprise an upper area of the electrically conductive contact and a lower area of the contact that has a smaller cross-section than the upper area. The semiconductor device may have a further characterization by which the upper and lower areas of the contact have the oval cross-section. The semiconductor device may have a further characterization by which the oval cross-section has a width that is shorter than a length, and outer sections of the contact at the width are closer to sidewalls of the first and second memory cells than outer sections of the electrically conductive contact at the length. The semiconductor device may further include the upper and lower areas of the electrically conductive contact are selected to meet minimum electrical resistance requirements.

Also described is a semiconductor device having a first non-volatile memory cell. The semiconductor device further includes a second non-volatile memory cell. The semiconductor device further includes an active region between the first and second non-volatile memory cells. The semiconductor device further includes an electrically conductive contact touching the active region, wherein the electrically conductive contact has a horizontal cross-section that is at least ten percent smaller in a first dimension than in a second dimension. The semiconductor device may have a further characterization by which the first dimension of the electrically conductive contact is oriented cross-wise to sidewalls of the first and second memory cells. The semiconductor device may have a further characterization by which the first dimension of the electrically conductive contact is oriented cross-wise to sidewalls of the first and second memory cells. The semiconductor device may have a further characterization by which the second dimension of the electrically conductive contact is oriented parallel to sidewalls of the first and second memory cells. The semiconductor device may have a further characterization by which the horizontal cross-section has an oval shape and the first dimension is a width of the oval shape and the second dimension is a length of the oval shape. The semiconductor device may further include a substrate, wherein the first and second non-volatile memory cells, the active region, and the electrically conductive contact are formed on the substrate. The semiconductor device may have a further characterization by which the active region has a length aligned parallel to sidewalls of the first and second non-volatile memory cells and an upper area of the electrically conductive contact has a length aligned parallel to sidewalls of the first and second memory cells, and the length of the upper area of the electrically conductive contact is greater than the length of the active region. The semiconductor device may further include a metal interconnect including a lower surface touching an upper area of the electrically conductive contact and a via including a lower area touching the metal interconnect and an upper area touching a metal layer.

Described also is a method of making a semiconductor device that includes forming an array of non-volatile memory cells on a substrate. The method further includes forming a plurality of active areas between the non-volatile memory cells. The method further includes forming isolation regions between the active areas. The method further includes forming electrically conductive contacts to the active areas, wherein the electrically conductive contacts have a first cross-sectional dimension between the non-volatile memory cells and a second cross-sectional dimension between the isolation regions, and the first cross-sectional dimension is smaller than the second cross-sectional dimension. The method may further include forming the electrically conductive contacts with an upper area and a lower area, wherein the lower area of the electrically conductive contacts have a smaller cross-section than the upper area. The method may have a further characterization by which the electrically conductive contacts have an oval cross-section. The method may further include forming the upper and lower areas of the electrically conductive contacts to meet minimum electrical resistance requirements. The method may further include forming metal interconnects including a lower surface in contact with an upper area of the contact and forming vias including lower areas in contact with the metal interconnects and upper areas in contact with a metal layer. The method may have a further characterization by which the first cross-sectional dimension is at least 5 percent smaller than the second cross-sectional dimension.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a first non-volatile memory cell having a first gate stack;
   a second non-volatile memory cell having a second gate stack, wherein the first nonvolatile memory cell and the second non-volatile memory cell share a source/drain region that is between the first gate stack and the second gate stack; and
   an electrically conductive contact touching the source/drain region and spaced from the first gate stack and the second gate stack, wherein:
      the contact has an oval cross-section touching and contained within the source drain region and having a short dimension and a long dimension;
      the short dimension is along a shortest line between the first gate stack and the second gate stack and the long dimension is orthogonal to the shortest line between the first gate stack and the second gate stack;
      the first gate stack and the second gate stack are spaced from the contact to reliably avoid touching the contact.

2. The semiconductor device of claim 1 wherein the electrically conductive contact conducts current for programming the first and second non-volatile memory cells.

3. The semiconductor device of claim 1 further comprising:
   an upper area of the electrically conductive contact; and
   a lower area of the contact, wherein the lower area has a smaller cross-section than the upper area and contacts the source/drain region with the oval cross section.

4. The semiconductor device of claim 3 wherein:
   the upper area of the contact has a second oval cross-section.

5. The semiconductor device of claim 3 further comprising:
   the upper and lower areas of the electrically conductive contact are selected to be conductive.

6. A semiconductor device comprising:
   a first non-volatile memory cell having a first gate stack;
   a second non-volatile memory cell having a second gate stack, wherein the first nonvolatile memory cell and the second non-volatile memory cell share a source/drain region that is between the first gate stack and the second gate stack; and
   an electrically conductive contact touching the source/drain region, wherein the electrically conductive contact has a horizontal cross-section touching the source/drain region that is at least ten percent smaller in a first dimension than in a second dimension, wherein the first dimension is measured along a line between the first and second gate stacks and is less than a distance between the first and second gate stacks to reliably avoid either the first gate stack or the second gate stack touching the contact.

7. The semiconductor device of claim 6 wherein:
   the second dimension of the electrically conductive contact is oriented parallel to sidewalls of the first and second gate stacks.

8. The semiconductor device of claim 6 wherein:
   the horizontal cross-section has an oval shape and the first dimension is a width of the oval shape and the second dimension is a length of the oval shape.

9. The semiconductor device of claim 6 further comprising:
   a substrate, wherein the first and second non-volatile memory cells, the source/drain region, and the electrically conductive contact are formed on the substrate.

10. The semiconductor device of claim 6 wherein:
    the source/drain region has a length aligned parallel to sidewalls of the first and second non-volatile memory cells; and
    an upper area of the electrically conductive contact has a length aligned parallel to sidewalls of the first and second memory cells, and the length of the upper area of the electrically conductive contact is greater than the length of an active region.

11. The semiconductor device of claim 6 further comprising:
    a metal interconnect including a lower surface touching an upper area of the electrically conductive contact.

12. A method of making a semiconductor device comprising:
    forming an array of non-volatile memory cells on a substrate having gate stacks, wherein the nonvolatile memory cells are separated by isolation regions and share source/drain regions between gate stacks; and
    forming electrically conductive contacts to the source/drain regions, wherein:
       the electrically conductive contacts are contained within the source/drain regions;

the electrically conductive contacts have a first cross-sectional dimension contacting the source/drain regions between the non-volatile memory cells and a second cross-sectional dimension contacting the source/drain regions between the isolation regions;

the electrically conductive contacts are spaced from the gate stacks to reliably avoid touching the gate stacks; and the first cross-sectional dimension is smaller than the second cross-sectional dimension.

13. The method of claim 12 further comprising:
forming the electrically conductive contacts with an upper area and a lower area, wherein the lower area of the electrically conductive contacts have a smaller cross-section than the upper area.

14. The method of claim 12 wherein:
the electrically conductive contacts have an oval cross-section.

15. The method of claim 14 further comprising:
forming the upper and lower areas of the electrically conductive contacts to be conductive.

16. The method of claim 13 further comprising:
forming metal interconnects including a lower surface in contact with an upper area of the contact.

17. The method of claim 12 wherein:
the first cross-sectional dimension is at least 5 percent smaller than the second cross-sectional dimension.

\* \* \* \* \*